(12) United States Patent
Cheng

(10) Patent No.: US 7,348,248 B2
(45) Date of Patent: Mar. 25, 2008

(54) CMOS TRANSISTOR WITH HIGH DRIVE CURRENT AND LOW SHEET RESISTANCE

(75) Inventor: Shui-Ming Cheng, Chu-bai (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 304 days.

(21) Appl. No.: 11/179,232

(22) Filed: Jul. 12, 2005

(65) Prior Publication Data

US 2007/0020866 A1    Jan. 25, 2007

(51) Int. Cl.
  *H01L 21/336* (2006.01)
(52) U.S. Cl. .............................. 438/301; 257/E21.634; 257/E21.438; 257/E21.439; 438/264
(58) Field of Classification Search ................ 438/301, 438/264; 257/E21.634, E21.438, E21.439
See application file for complete search history.

(56) References Cited

U.S. PATENT DOCUMENTS

| | | | |
|---|---|---|---|
| 5,444,282 A | 8/1995 | Yamaguchi et al. | |
| 5,719,425 A | 2/1998 | Akram et al. | |
| 5,869,879 A * | 2/1999 | Fulford et al. | 257/510 |
| 5,949,105 A | 9/1999 | Moslehi | |
| 6,187,641 B1 | 2/2001 | Rodder et al. | |
| 6,252,277 B1 * | 6/2001 | Chan et al. | 257/330 |
| 6,258,680 B1 | 7/2001 | Fulford, Jr. et al. | |
| 6,348,390 B1 | 2/2002 | Wu | |
| 6,524,938 B1 | 2/2003 | Tao et al. | |
| 6,713,357 B1 | 3/2004 | Wang et al. | |
| 6,774,409 B2 | 8/2004 | Baba et al. | |
| 7,105,413 B2 * | 9/2006 | Nahm et al. | 438/305 |
| 7,132,719 B2 * | 11/2006 | Koh | 257/408 |
| 2003/0098486 A1 | 5/2003 | Sambonsugi et al. | |
| 2004/0173815 A1 | 9/2004 | Yeo et al. | |
| 2004/0175872 A1 | 9/2004 | Yeo et al. | |
| 2004/0195646 A1 | 10/2004 | Yeo et al. | |

OTHER PUBLICATIONS

Chidambaram, P.R., et al., "35% Drive Current Improvement from Recessed-SiGe Drain Extensions on 37 nm Gate Length PMOS," 2004 Symposium on VLSI Technology Digest of Technical Papers, IEEE, pp. 48-49.
Ghani, T., et al., "A 90nm High Volume Manufacturing Logic Technology Featuring Novel 45nm Gate Length Strained Silicon CMOS Transistors," IEDM, 2003, pp. 978-980.
Shimizu, A., et al., "Local Mechanical-Stress Control (LMC): A New Technique for CMOS-Performance Enhancement," IEDM, 2001, pp. 433-436.

* cited by examiner

*Primary Examiner*—Michael Lebentritt
*Assistant Examiner*—Thu-Huong Dinh
(74) *Attorney, Agent, or Firm*—Slater & Matsil, L.L.P.

(57) ABSTRACT

A semiconductor structure and a method for forming the same are provided. The semiconductor structure includes a gate dielectric over a substrate, a gate electrode over the gate dielectric, a slim gate spacer along a side of the gate electrode, and a source/drain region substantially aligned with an edge of the slim gate spacer. The source/drain region includes a first implantation region having an overlap with the gate electrode, a second implantation region further away from the channel region than the first implantation region, and a third implantation region further away from the channel region than the second implantation region. The source/drain region preferably further comprises an epitaxy region spaced apart from the slim gate spacer.

15 Claims, 7 Drawing Sheets

CMOS TRANSISTOR WITH HIGH DRIVE CURRENT AND LOW SHEET RESISTANCE

TECHNICAL FIELD

This invention relates generally to semiconductor devices, and more particularly to the manufacturing processes of MOS devices using multiple spacers, and even more particularly to reducing source/drain sheet resistance through multiple implantations.

BACKGROUND

With transistor dimensions continuously shrinking, short channel effects (SCE), poly gate activation, and junction capacitance become critical issues in MOS device design. For transistors manufactured with a narrow spacer scheme, post gate doping and graded source/drain energy need to be reduced to maintain an acceptable SCE control. This results in poly depletion effects and high junction capacitance. With a conventional single-spacer process, it is hard to achieve improved short channel effect, good poly gate activation, and lower junction capacitance simultaneously. Particularly, in order to reduce the hot carrier effect, lightly doped drains (LDD) are increasingly used close to the channel. However, this causes higher sheet resistance between the source/drain regions and the channel region and thus low drain saturation current due to low impurity concentration.

What is needed in the art is a method for manufacturing semiconductor devices that does not suffer from the deficiencies of conventional techniques. The method can be implemented by using multiple spacers and slim spacers.

SUMMARY OF THE INVENTION

The preferred embodiments of the present invention provide a novel semiconductor structure having improved source/drain sheet resistance and drain saturation current and a method for forming the same.

In accordance with one aspect of the present invention, a preferred method embodiment of the present invention includes forming a gate dielectric over a substrate, forming a gate electrode over the gate dielectric, forming a slim gate spacer along a side of the gate electrode, and forming a source/drain region. The source/drain region includes a first implantation region having an overlap with the gate electrode, a second implantation region further away from the channel region than the first implantation region, and a third implantation region further away from the channel region than the second implantation region. The method preferably further includes forming an epitaxy region in the source/drain region.

In accordance with another aspect of the present invention, a preferred method embodiment of the present invention forms a pMOS device and an nMOS device. The method comprises the steps of providing a substrate with a first device region and a second device region, forming a first gate dielectric over the substrate, a first gate electrode over the first dielectric and a first hard mask over the first gate electrode in the first device region, forming a second gate dielectric over the substrate, a second gate electrode over the second dielectric and a second hard mask over the second gate electrode in the second device region, implanting impurities into the first and second device regions using respective first and second gate electrodes as masks and thus forming first implantation regions in the first and second device regions respectively, forming thick spacers along edges of the first and second gate stacks, forming second implantation regions in the first and second device regions using the thick spacers as masks; etching the second gate spacers to form slim gate spacers so that the slim gate spacers are thinner than the respective thick gate spacers, and forming third implantation regions in the first and second device regions using the slim gate spacers as masks.

In accordance with another aspect of the present invention, the semiconductor structure embodiment includes a gate dielectric over a substrate, a gate electrode over the gate dielectric, a slim spacer along a side of the gate electrode, and a source/drain region substantially aligned with the slim spacer. The source/drain region includes a first implantation region having an overlap with the gate electrode, a second implantation region further away from the channel region than the first implantation region, and a third implantation region further away from the channel region than the second implantation region. The semiconductor structure preferably further comprises an epitaxy region spaced apart from the slim gate spacer.

In accordance with another aspect of the present invention, the semiconductor structure embodiment further includes an epitaxy region in the source/drain region. The epitaxy region is preferably separated from the slim spacer and provides a desired strain to the channel region of the device.

In accordance with yet another aspect of the present invention, the source/drain region further includes recesses caused by dry etchings that are performed to remove intermediate spacers. Adjacent shallow trench isolations are further recessed to reduce or eliminate undesired strain applied to the channel region.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing a preferred embodiment of the present invention, which combines a pMOS and an nMOS device, are illustrated. Variations of the preferred embodiment are then discussed. Throughout the various views and illustrative embodiments of the present invention, like reference numbers are used to designate like elements.

Figure 1:
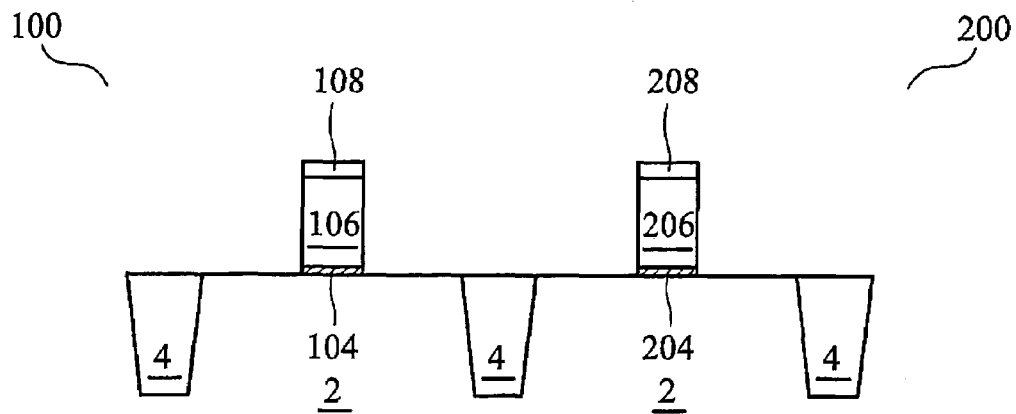
FIGS. 1 through 16 are cross-sectional views of intermediate stages in the manufacture of a semiconductor structure embodiment, a pMOS and an nMOS device being formed.
Figure 2:
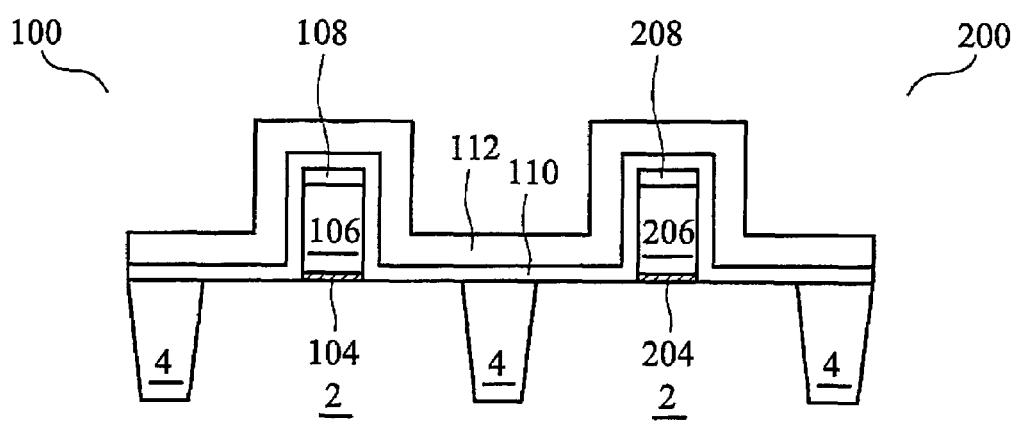

FIG. 1 illustrates a substrate 2 comprising two regions, a region 100 for forming a pMOS device and a region 200 for forming an nMOS device. Shallow trench isolations 4 isolate the device regions. A gate stack comprising a gate dielectric 104 and a gate electrode 106 is formed in the pMOS region 100. Similarly, a gate stack comprising a gate dielectric 204 and a gate electrode 206 is formed in the nMOS region 200. The gate dielectrics 104 and 204 preferably have high k values. Substrate 2 is preferably bulk silicon, but other commonly used materials and structures such as silicon on insulator (SOI) can also be used. Gate stacks are preferably arranged in a way that current flow in the resulting devices is in a <100> or <110> direction. The gate stacks are masked by the hard masks 108 and 208, respectively, which are preferably formed of materials such as oxide, silicon nitride, silicon oxynitride, organic material, and combinations thereof.

A dummy layer, which is used to form spacers, is then formed over the entire pMOS region 100 and nMOS region 200. In the preferred embodiment, the dummy layer comprises a liner oxide layer 110 and a nitride layer 112, and has a thickness of between about 20 Å and about 500 Å. In alternative embodiments, the dummy layer may have single or composite layers comprising oxide, silicon nitride, silicon oxynitride (SiON) and/or other low-k materials, and may be formed using commonly used techniques, such as plasma enhanced chemical vapor deposition (PECVD), low-pressure chemical vapor deposition (LPCVD), sub-atmospheric chemical vapor deposition (SACVD), etc. Throughout the description, other spacers formed in subsequent processes may use similar materials as in the dummy layer.

Figure 3:
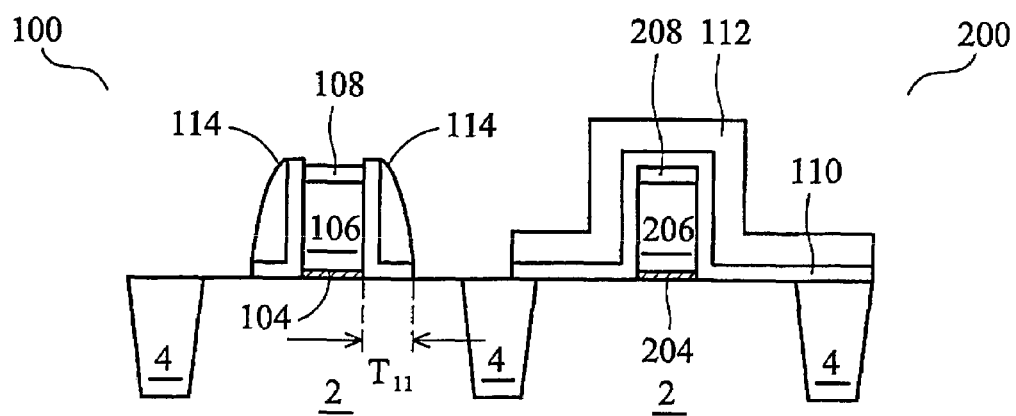

FIG. 3 illustrates the liner oxide layer 110 and nitride layer 112 in pMOS region 100 being patterned into gate spacers 114. Either wet etching or dry etching may be used for patterning. Spacers 114 may comprise a liner oxide portion and a nitride portion. Preferably, the thickness $T_{11}$ of the spacers 114 is between about 50 Å and about 350 Å.

Figure 4:
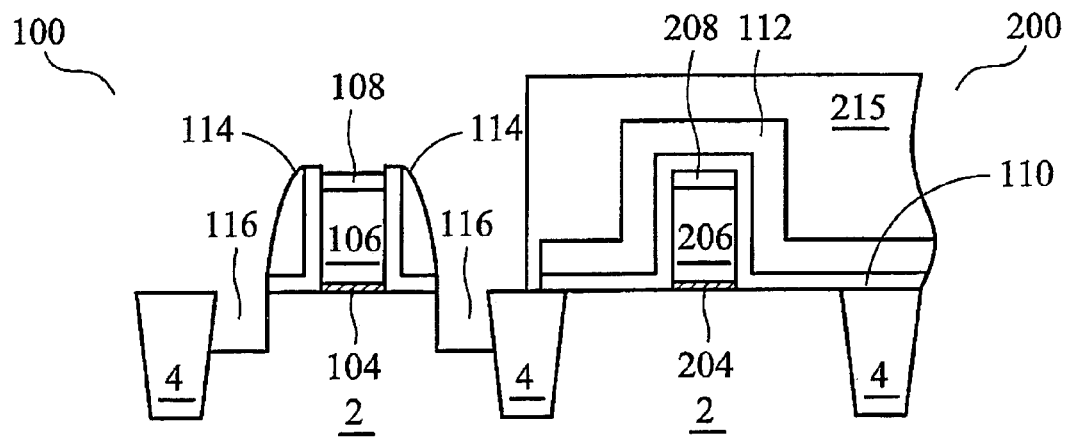

In the preferred embodiment, epitaxy regions are formed in order to form part of the source/drain regions. FIG. 4 illustrates a photo resist 215 formed over the nMOS region 200. Recesses 116 are formed along the outside edges of the spacers 114, preferably by etching isotropically and/or anisotropically. The preferred depth of the recesses 116 is between about 0 Å and about 1000 Å, and more preferably about 250 Å and 450 Å. In alternative embodiments, impurities are implanted to form entire source/drain regions. The formation of the source/drain regions of the nMOS devices, which will be discussed in detail in subsequent paragraphs, explains how source/drain regions are formed by implanting impurities only.

Figure 5:
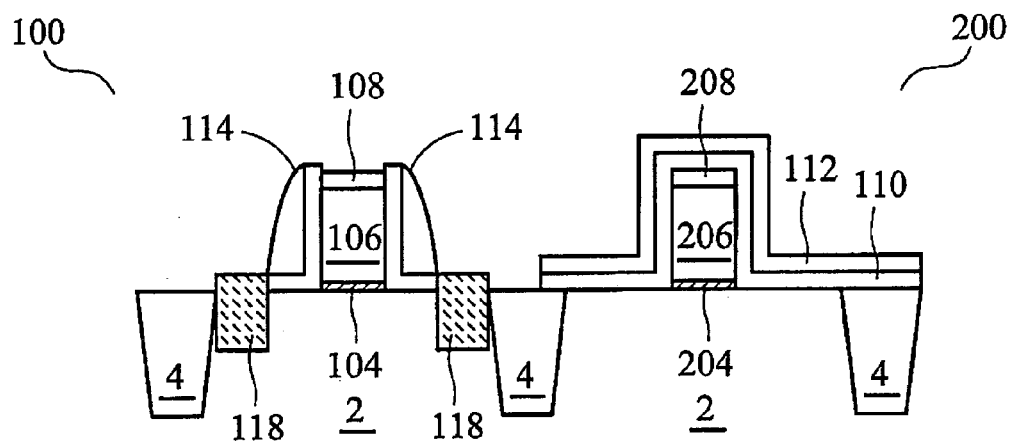

FIG. 5 illustrates the formation of epitaxy regions 118 through epitaxial growth in recesses 116. It is preferred that SiGe epitaxy regions are formed in pMOS devices. Typically, SiGe epitaxy regions will introduce a compressive stress in the channel region so that the device drive current will be enhanced. However, SiGe epitaxy regions will degrade nMOS device drive current. Therefore, silicon carbide (SiC) epitaxy regions are preferably formed for nMOS devices.

Figure 6:
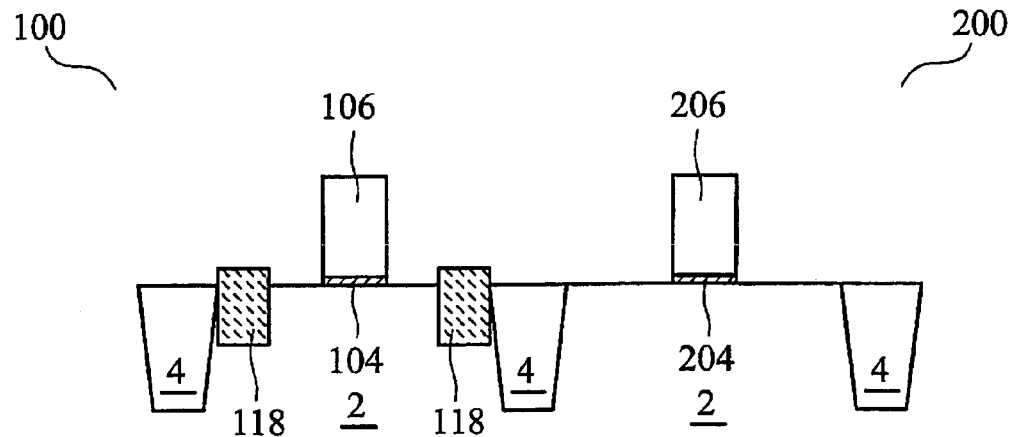

In FIG. 6, photo resist 215 is removed. The spacers 114, liner oxide layer 110, silicon nitride layer 112 and hard masks 108 and 208 are also removed. In the preferred embodiment, the removal is performed using wet etching. In other embodiments, dry etching, which causes exposed substrate 2 and epitaxy regions 118 to be recessed, is used.

Figure 7:
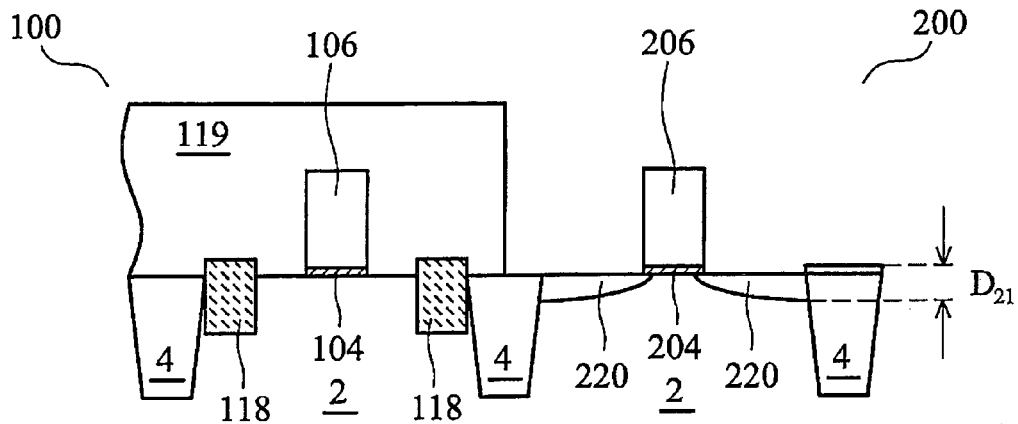
Figure 8:
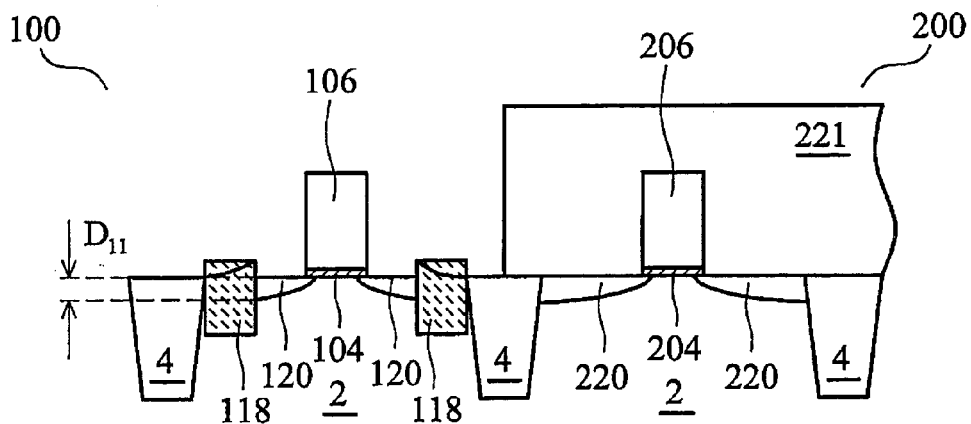

FIGS. 7 and 8 illustrate the formation of lightly doped drains (LDD) for pMOS and nMOS devices. FIG. 7 illustrates an implantation introducing n type impurities into the nMOS region 200. Implantation regions 220 are formed substantially aligned with the edges of the gate electrode 206. A photo resist layer 119 is formed over and masks the pMOS region 100. Preferably, regions 220 have a depth of between about 100 Å and about 250 Å. Similarly, FIG. 8 illustrates the pMOS regions doped with p type impurities while the nMOS region 200 is masked by a photo resist 221, forming implantation regions 120. Regions 120 and 220 are lightly doped and a dopant concentration in the range of about $1E18\ cm^{-3}$ to about $1E22\ cm^{-3}$ may be employed. Due to lateral diffusion; regions 120 and 220 will diffuse under the respective gate electrodes 106 and 206 and overlaps are formed.

Figure 9:
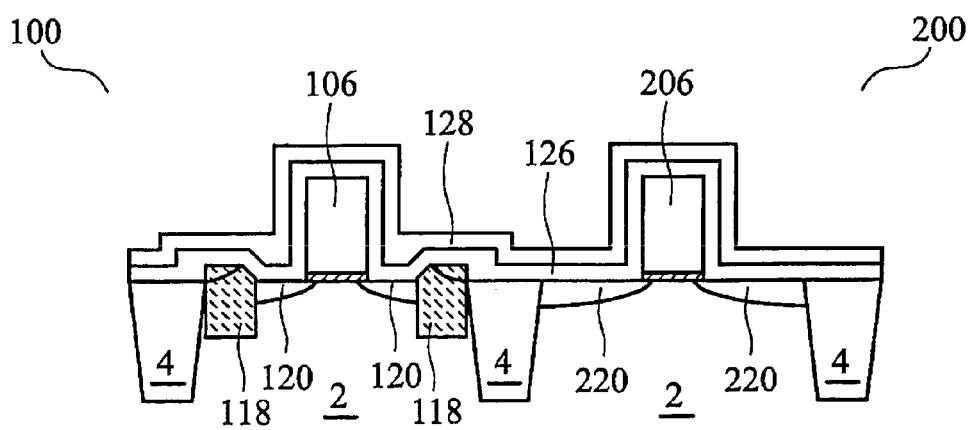
Figure 10:
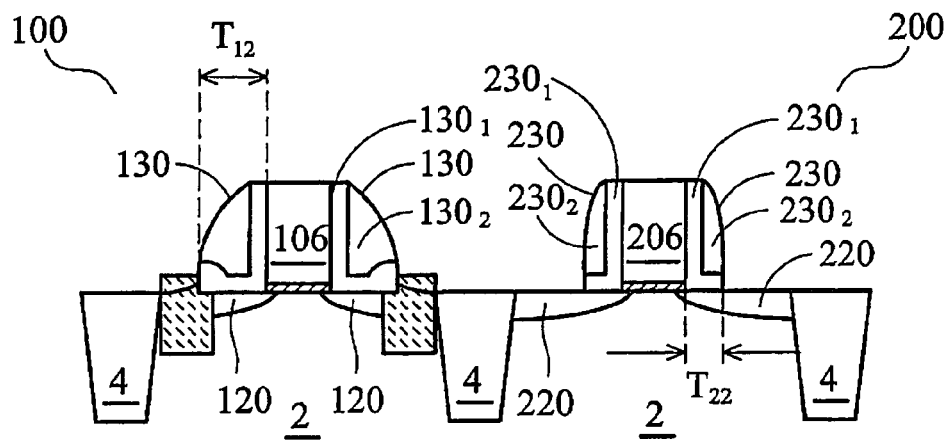
Figure 10A:
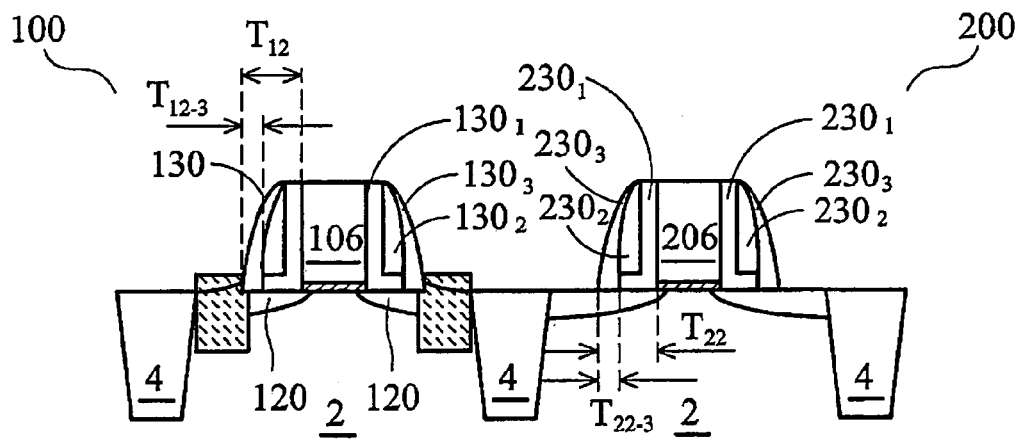

FIG. 9 illustrates the formation of spacers. In one embodiment, a liner oxide layer 126 and a nitride layer 128 are formed over the entire pMOS region 100 and nMOS region 200. The two layers are then patterned to form spacers 130 for pMOS devices and spacers 230 for nMOS devices. The resulting structure is shown in FIG. 10. The thickness $T_{12}$ of the spacers 130 and thickness $T_{22}$ of the spacers 230 are preferably between about 250 Å and about 500 Å, respectively. Alternative embodiments, as shown in FIG. 10A, further comprise a third layer $130_3$, preferably formed of oxide or silicon oxynitride, on the nitride layer 128, and the three layers are patterned to form the gate spacers 130 and 230. Preferably, the thickness $T_{12-3}$ of the third layer is between about 25% and about 75% of the total thickness $T_{12}$ of the spacers 130, and the thickness $T_{22-3}$ of the third layer is between about 25% and about 75% of the total thickness $T_{22}$ of the spacers 230.

Figure 11:
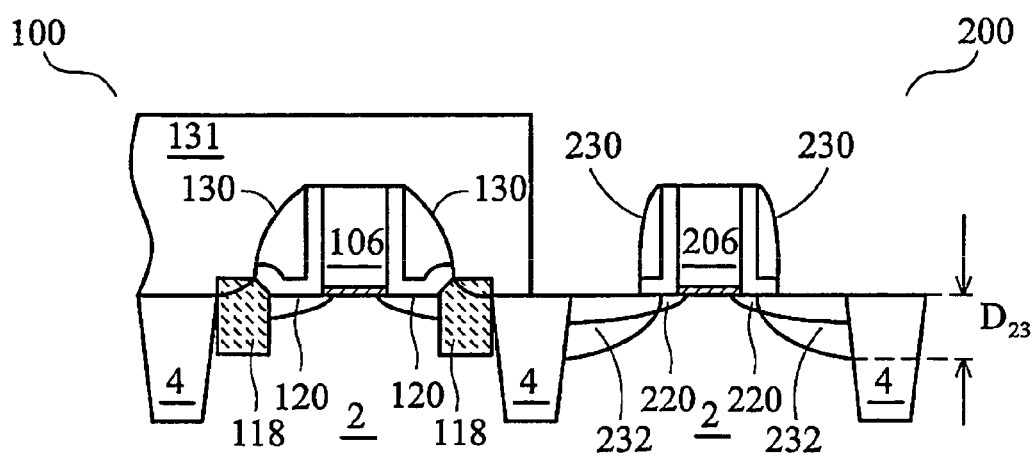

FIG. 11 illustrates the formation of deeper implantation regions 232 in the nMOS region 200. During the implantation, pMOS region 100 is masked by a photo resist 131. Due to the masking of the spacers 230, the implantation regions 232 are further away from the channel region than the implantation regions 220. The depth $D_{23}$ is preferably greater than the depth $D_{21}$ (referring to FIG. 7) of the implantation region 220.

Figure 12:
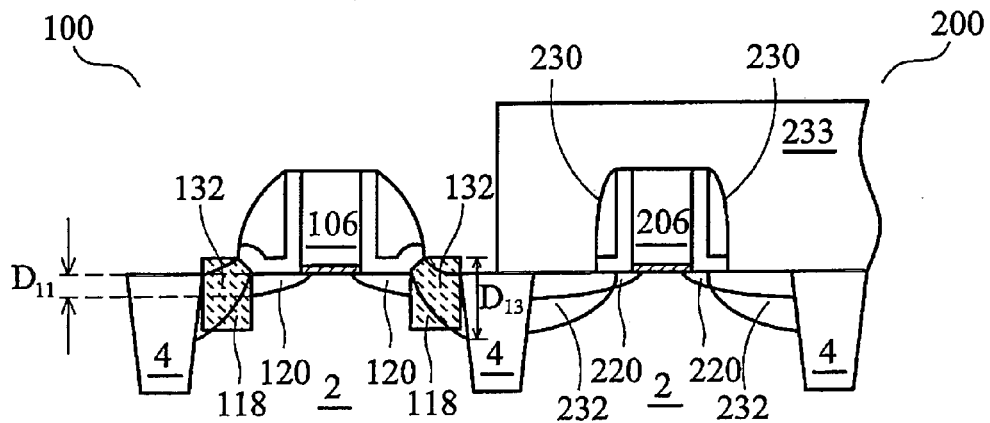

FIG. 12 illustrates a similar process on the pMOS side. The photo resist 131 is removed and a photo resist 233 is formed to protect nMOS region 200. An implantation forms implantation regions 132 further away from the channel region than the implantation region 120. The depth $D_{13}$ of the implantation regions 132 is preferably greater than the depth $D_{11}$ of the implantation regions 120.

Figure 13:
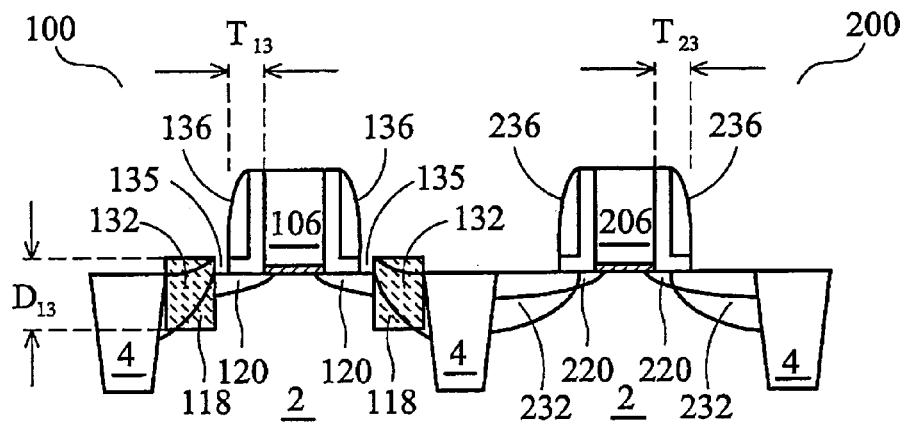
Figure 13A:
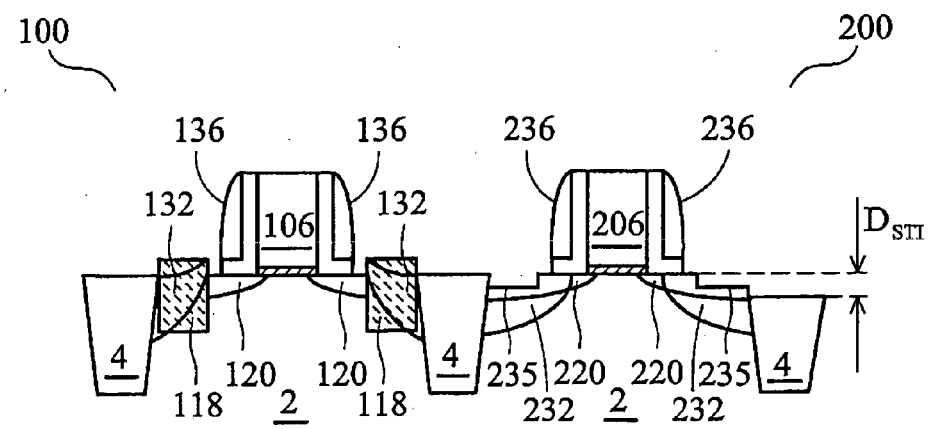

The photo resist 233 is then removed. FIG. 13 illustrates the formation of slim spacers 136 and 236, preferably by etching to make spacers 130 and 230 thinner. The preferred thickness of the slim spacers 136 and 236 is between about 200 Å and 450 Å. The thickness difference before and after etching is preferably between about 0 Å and 500 Å. Gaps 135, also referred to as separation regions 135, with a width of between about 0 Å and 500 Å, and more preferably about 250 Å, are formed between the spacers 136 and respective epitaxy regions 118. In the preferred embodiment, slim spacers 136 and 236 are formed by wet etching. In alternative embodiments, dry etching is performed. FIG. 13A illustrates the structure after performing dry etching wherein the exposed surfaces 235 are recessed to a lower level than the surface of the substrate 2. The shallow trench isolations 4 are preferably recessed simultaneously as the spacers 130 and 230 are dry etched. Recessing the surface of the STIs 4 can reduce undesired strain applied to the channel region. The recessed depth $D_{STI}$ is preferably between about 250 Å and about 1000 Å. Recessing STIs 4 may also be combined with other processes, such as silicide pre-cleaning, so that less process steps are performed and production cost is reduced.

If spacers 130 and 230 have the structures shown in FIG. 10A, simply removing the outmost portions 130₃ and 230₃ of the respective spacers 130 and 230 will form the respective slim spacers 136 and 236.

Figure 14:
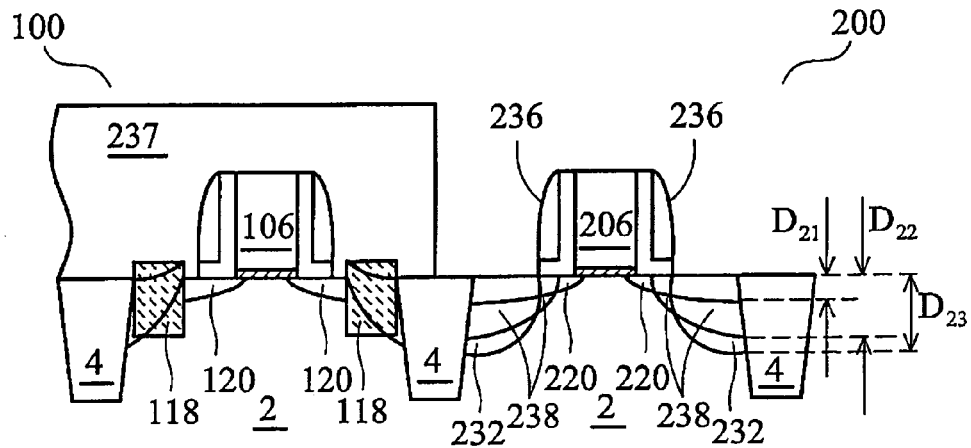
Figure 15:
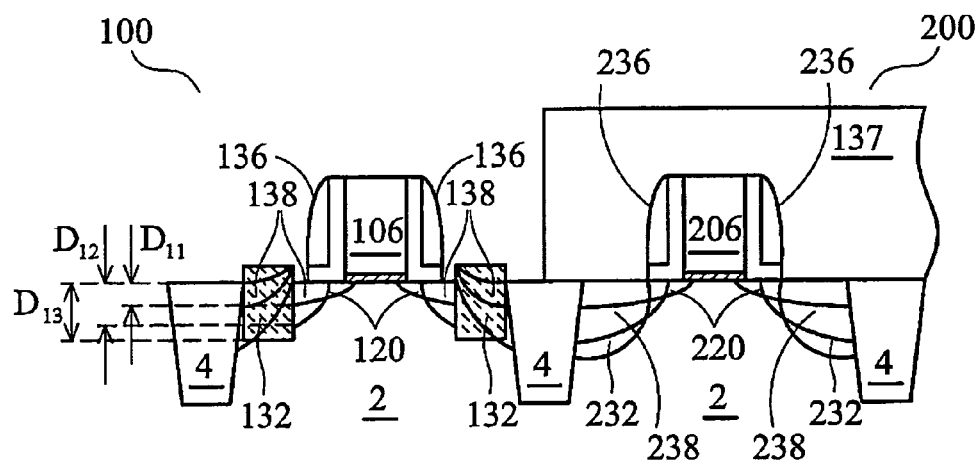

PMOS and nMOS devices are then subject to another impurity implantation. FIG. 14 illustrates an implantation on the nMOS side. PMOS region 100 is masked by a photo resist 237. The implantation creates implantation regions 238. With the masking of the slim spacers 236, the implantation regions 238 are closer to the channel region than implantation regions 232, but further away than the implantation regions 220. The thickness $D_{22}$ is preferably greater than $D_{21}$ but less than $D_{23}$. Similarly, FIG. 15 illustrates an impurity implantation on the pMOS side. NMOS region 200 is masked by a photo resist 137. The implantation creates implantation regions 138 that are preferably closer to the channel region than implantation regions 132, but further away than the implantation regions 120. The thickness $D_{12}$ is preferably greater than $D_{11}$ but less than $D_{13}$.

Figure 16:
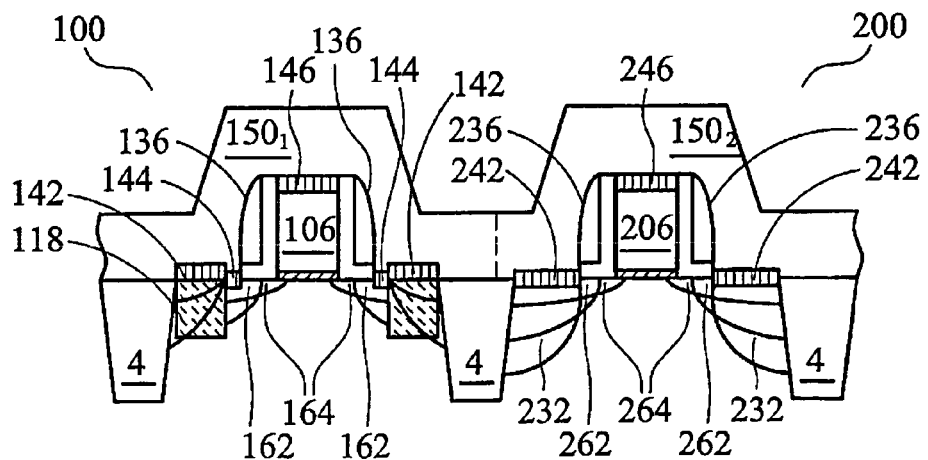

A silicidation is then performed to form silicide regions on exposed semiconductor material, as illustrated in FIG. 16. Silicides may comprise metals such as titanium, cobalt, nickel, palladium, platinum, erbium, and the like. As is known in the art, the silicidation is preferably performed by blanket deposition of an appropriate metal layer, followed by an annealing step in which the metal reacts with underlying exposed silicon. Un-reacted metal is then removed, preferably with a selective etch process. In the pMOS region 100, silicides 142 and 146 are formed on the source/drain regions and gate electrode respectively. Due to exposed substrate 2 in the gaps 135, silicides 144 are formed also. In the nMOS region 200, silicides 242 and 246 are also formed.

FIG. 16 also illustrates the formation of a contact etch stop layer (CESL) 150. In the preferred embodiment, the CESL 150 comprises a first portion 150₁ over the pMOS region, which provides a compressive stress to the channel region of the pMOS device, and a second portion 150₂ over the nMOS region, which provides a tensile stress to the channel of the nMOS device. In other embodiments, entire CESL 150 provides a tensile stress. CESL 150 preferably has a thickness of between about 350 Å and about 1000 Å, and provides a stress of between about 0.01 Gpa and about 2 Gpa. CESL 150 may be formed using techniques such as plasma enhanced chemical vapor deposition (PECVD), low pressure CVD (LPCVD), the combination of PECVD and LPCVD, and other appropriate techniques.

In the previously discussed embodiment of the present invention, more than one spacer is formed for each device and some are disposable. Three implantations are performed for forming the preferred embodiments of the present invention. By using gate electrode 106 and 206 as masks, implantation regions 120 and 220 are formed closest to the channel region of the respective devices. Therefore, the gates can effectively control the switch of the devices. On the pMOS device side, regions 164 are lightly doped so that hot carrier effect is reduced. Regions 164 are coupled to silicides 142 through low sheet resistance regions 162. Regions 162 have impurities introduced in two implantation steps and thus the impurity concentration is relatively high and the sheet resistance is low. Silicides 144 further couple the source/drain regions 118 and the respective regions 162. Therefore, overall sheet resistance is low. With low sheet resistance, the saturation drain current is improved. Similarly, on the nMOS side, lightly doped regions 264 are coupled to silicides 242 by low sheet resistance regions 262. Therefore, overall sheet resistance is reduced and saturation drain current is improved.

In the preferred embodiment, since slim spacers 136 and 236 occupy less space, a thicker CESL 150 can be formed. As known in the art, a thick CESL is beneficial for applying strain to the underlying devices. Also, with slim spacers, larger contact landing areas are provided.

The previously discussed preferred embodiment illustrates one sequence of the formation of the three implantations. In other embodiments, three implantations can be performed in other orders without affecting the performance of the device. For example, after the implantation regions 120 and 220 formed, as referred to in FIG. 8, slim spacers may be formed and a second implantation is performed using the slim spacers as masks. Additional spacers are then formed along the outer edges of the slim spacers, making the spacers thicker. A third implantation may be performed using the thicker spacers as masks. The additional spacers are then removed, leaving slim spacers in a final structure. Preferably, the thickness of the slim spacers is between about 25% and 75% of the combined thickness of the slim spacer and additional spacer. In yet other embodiments, the source/drain regions can be raised and formed on the substrate 2, and can be formed by methods such as epitaxy, ultra-high vacuum CVD, atomic layer deposition (ALCVD), and molecular beam epitaxy (MBE).

Figure 17:
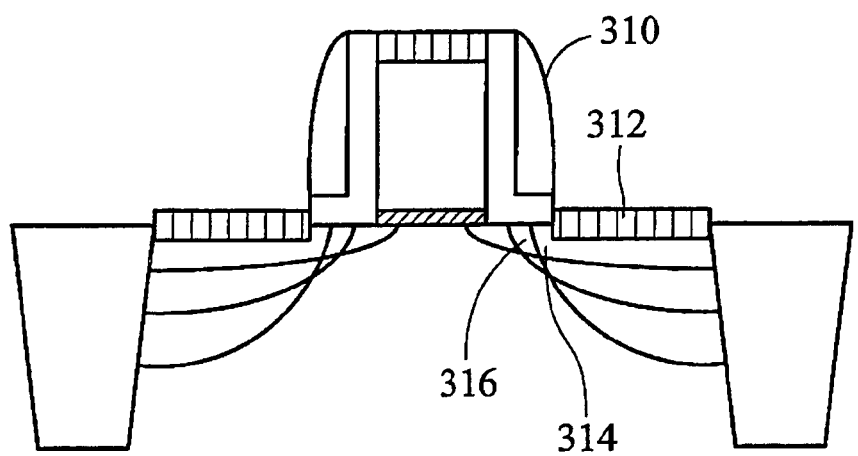
FIG. 17 illustrates a variation of the preferred embodiment of the present invention, wherein an epitaxy region is formed adjacent a slim spacer.

FIG. 17 illustrates a variation of the preferred embodiment of the present invention. As has been discussed previously, the gaps 135 referred to in FIG. 13 may have a width of as little as 0 Å. Therefore, the spacers 310 will be adjacent the respective source/drain silicides 312. In this embodiment, the overall sheet resistance of the source/drain is still low since regions 314 and 316, which are highly doped and thus have low sheet resistance, couple the respective source/drain silicides 312 to the channel region of the device.

Figure 18:
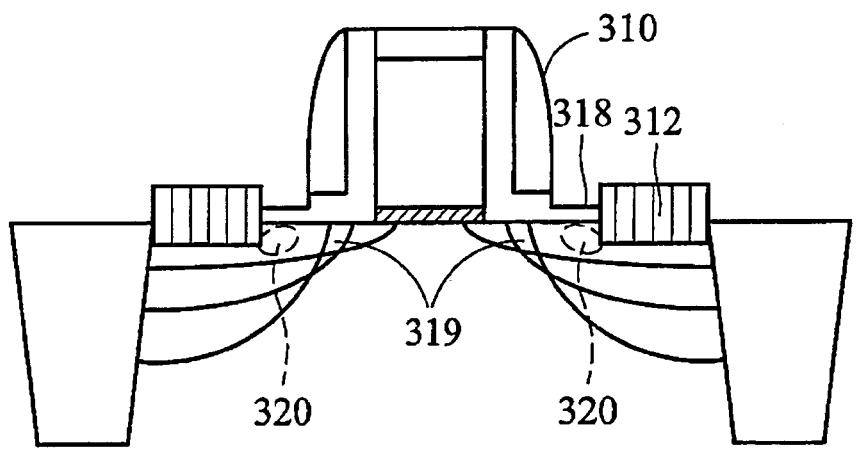
FIG. 18 illustrates a variation of the preferred embodiment of the present invention wherein a dielectric region is between an epitaxy region and a lightly doped source/drain region.

FIG. 18 illustrates another variation of the preferred embodiment of the present invention. If the dielectric layer 126 (referring to FIGS. 9 and 13) is not completely removed, leaving portions 318, no silicide will be formed in the gaps 135. Since the doping concentrations in regions 319 and 320 are high, the overall sheet resistance of the source/drain is low, even though it may be higher than that of the preferred embodiment.

Figure 19:
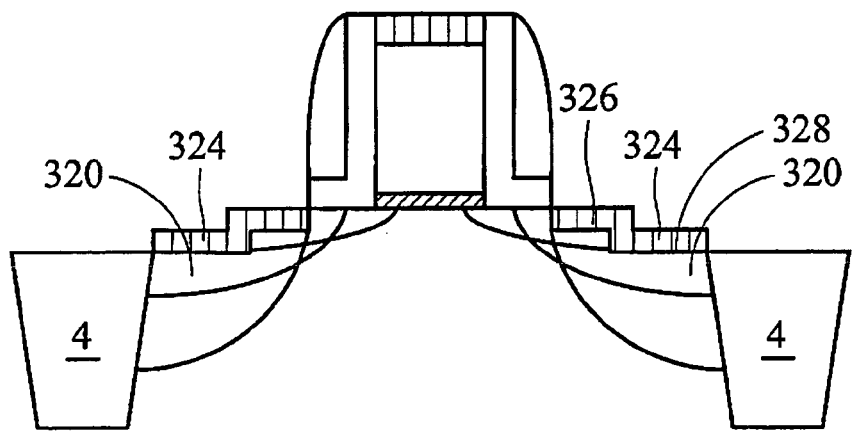
FIG. 19 illustrates a variation of the preferred embodiment of the present invention wherein recesses are formed in source/drain regions and shallow trench isolations.

FIG. 19 illustrates yet another variation of the preferred embodiment. As has been illustrated in FIG. 13A, if dry etching is used to remove the disposable spacers, the exposed surface of the substrate 2 will be etched and thus portions of the surface of the source/drain regions 320 are lowered. In an example shown in FIG. 19, a first recessed surface 326 is caused by the spacer removal step referred to in FIG. 6, and a second recessed surface 328 is caused by the spacer removal step referred to in FIG. 13A. Depending on the formation processes, one or more levels of recesses may be formed on each side of the gate. It is known in the art that STIs 4 typically apply a strain to the channel region of the device. The strain applied may be detrimental to the device. With a recessed STI structure, top surfaces of the STIs 4 are lower than the channel region so that the detrimental strain applied by the STIs 4 is eliminated or reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, the method comprising:
    forming a gate dielectric over a channel region in a substrate;
    forming a gate electrode over the gate dielectric;
    forming a gate spacer along a side of the gate electrode;
    forming a disposable spacer along an edge of the gate spacer;
    forming a recess along an outer edge of the disposable spacer;
    forming an epitaxial region in the recess wherein a gap is formed between the epitaxial region and an outer edge of the gate spacer; and
    forming a source/drain region substantially aligned with the gate spacer wherein the source/drain region comprises:
        a first implantation region overlapping the gate electrode;
        a second implantation region further away from the channel region than the first implantation region; and
        a third implantation region further away from the channel region than the second implantation region.

2. The method of claim 1 wherein the step of forming the source/drain region comprises:
    implanting the first implantation region with the gate electrode as a mask;
    forming a thick spacer having a width of greater than the width of the gate spacer along the gate electrode;
    implanting the third implantation region using the thick spacer as a mask;
    forming the gate spacer along the gate electrode; and
    implanting the second implantation region using the gate spacer as a mask.

3. The method of claim 2 wherein the gate spacer is formed by etching an outer portion of a thick spacer.

4. The method of claim 3 wherein the thick spacer is etched using dry etch and thus forms a recess in the source/drain region.

5. The method of claim 4 further comprising recessing a shallow trench isolation adjacent the source/drain region.

6. The method of claim 5 wherein the step of recessing the shallow trench isolation is performed simultaneously with the step of etching the thick spacer.

7. The method of claim 1 wherein the gap is less than about 500 Å.

8. The method of claim 1 further comprising a step of forming a silicide region in the gap.

9. The method of claim 1 further comprising forming a hard mask over the gate electrode wherein the hard mask is formed of a material selected from the group consisting essentially of oxide, nitride, organic material, and combinations thereof.

10. The method of claim 1 further comprising forming a contact etch stop layer having a thickness of between about 350 Å and about 1000 Å over the gate electrode, the gate spacer and the source/drain region.

11. A method of forming a semiconductor structure, the method comprising:
    providing a substrate with a first device region and a second device region;
    forming a first gate dielectric over the substrate, a first gate electrode over the first gate dielectric and a first hard mask over the first gate electrode in the first device region;
    forming a second gate dielectric over the substrate, a second gate electrode over the second gate dielectric and a second hard mask over the second gate electrode in the second device region;
    implanting impurities into the first and second device regions using the first and second gate electrodes respectively as masks and thus forming first implantation regions in the first and second device regions respectively;
    forming thick spacers along edges of the first and second gate electrodes;
    forming second implantation regions in the first and second device regions using the thick spacers as masks;
    etching the thick spacers to form gate spacers so that the gate spacers are thinner than the respective thick spacers, wherein the gate spacers have a width of between about 200 Å and about 450 Å; and
    forming third implantation regions in the first and second device regions using the respective gate spacers as masks, wherein the first implantation region, the second implantation region, and the third implantation region in the first device region are of p-type, and wherein the first implantation region, the second implantation region, and the third implantation region in the second device region are of n-type.

12. The method of claim 11 further comprising the steps of:
    forming a disposable spacer along at least one side edge of the first and second electrodes;
    forming a recess in the substrate aligned with the disposable spacer; and
    growing an epitaxial region in the recess.

13. The method of claim 11 further comprising siliciding exposed semiconductor material in the first and second device regions.

14. The method of claim 11 further comprising recessing shallow trench isolations adjacent the respective first and second device regions.

15. The method of claim 11 further comprising forming a contact etch stop layer having a thickness of between about 350 Å and about 1000 Å in the first and second device regions.

* * * * *